United States Patent [19]

Fukase

[11] Patent Number: 5,728,595
[45] Date of Patent: Mar. 17, 1998

[54] METHOD OF FABRICATING A SELF-ALIGNED CONTACT HOLE FOR A SEMICONDUCTOR DEVICE

[75] Inventor: Tadashi Fukase, Tokyo, Japan

[73] Assignee: NEC Corporation, Japan

[21] Appl. No.: 605,496

[22] Filed: Feb. 26, 1996

[30] Foreign Application Priority Data

Feb. 22, 1995 [JP] Japan .................... 7-040221

[51] Int. Cl.⁶ .................................. H01L 21/265
[52] U.S. Cl. .................. 437/44; 437/203; 437/228; 437/235; 437/195
[58] Field of Search ................ 437/194, 195, 437/203, 52, 44, 48, 51, 235, 236, 228

[56] References Cited

U.S. PATENT DOCUMENTS

| | | | |
|---|---|---|---|
| 5,135,881 | 8/1992 | Saeki | 437/233 |
| 5,296,400 | 3/1994 | Park et al. | 437/235 |
| 5,399,532 | 3/1995 | Lee et al. | 437/233 |
| 5,482,894 | 1/1996 | Havemann | 437/195 |
| 5,550,071 | 8/1996 | Ryou | 437/195 |
| 5,580,811 | 12/1996 | Kim | 437/60 |

FOREIGN PATENT DOCUMENTS 3-106027  5/1991  Japan .................... H01L 21/3205

*Primary Examiner*—Tuan H. Nguyen
*Attorney, Agent, or Firm*—Hayes, Soloway, Hennessey, Grossman & Hage, P.C.

[57] ABSTRACT

A plurality of gate electrodes are formed over a semiconductor substrate. An etching stopper layer is formed on these plurality of gate electrodes. Sidewall layers are formed on the side faces of the plurality of gate electrodes. An interlayer insulating film covering the plurality of gate electrodes and the sidewall layers is formed. A contact hole is formed in the interlayer insulating film among the plurality of gate electrodes. Here, the contact hole is formed in the interlayer insulating film by making the etching rate of the etching stopper film lower than the etching rate of the interlayer insulating film and the etching rate of the sidewall layer substantially equivalent to or higher than the etching rate of the interlayer insulating film.

19 Claims, 11 Drawing Sheets

METHOD OF FABRICATING A SELF-ALIGNED CONTACT HOLE FOR A SEMICONDUCTOR DEVICE

BACKGROUND OF THE INVENTION

The present invention relates to a method of fabricating a semiconductor device, and more particularly to a method of forming a contact hole of a wiring.

Refinement and high densification of semiconductor devices have been carried forward as energetically as ever, and a semiconductor device of ultrahigh integration such as 1 gigabit dynamic random access memory (DRAM) designed with the design standard of 256 megabit or less designed on the dimensional standard of 0.25 μm is being developed and fabricated by way of trial at present. As semiconductor devices are integrated highly, it has become to be demanded strongly to further reduce a mask alignment margin in a lithography process that is essential in forming a semiconductor element structure or to make the margin unnecessary.

Normally, when a semiconductor device is fabricated, patterns formed of various materials such as a metal film, a semiconductor film and an insulator film are laminated one after another on a semiconductor substrate, thus forming a semiconductor element having a microscopic structure. When those patterns for the semiconductor element are laminated, it is demanded, in a lithography process, to perform mask alignment to the pattern in the lower layer formed in a preprocess and to form a next upper layer pattern. However, misregistration between upper layer/lower layer patterns is generated in this lithography process. Therefore, it is required to leave a room in the pattern spacing on the mask anticipating the misregistration so as to set a margin in the pattern spacing. However, such a margin causes an impediment against high densification of the pattern.

Thereupon, technical methods of obtaining a margin-less structure that makes such a margin as described above unnecessary are started to be examined in various ways. It is important in particular among those technical methods to obtain a margin-less structure in forming a contact hole. Since this contact hole is formed in various layers on a semiconductor substrate, on a semiconductor film and on a metal film and is used frequently, it is most effective for achieving high densification/high integration of a semiconductor device to form the contact hole margin-less. Effective methods among these techniques to obtain a margin-less contact hole include a method of fabricating a self-aligned contact hole, and various concrete methods are being investigated. As one example, an etching stopper film having etching selectivity on an interlayer insulating film is provided on a wiring, so that the wiring is not etched by the etching for fabricating a contact hole.

For example, in the Japanese Patent Laid-Open No. Hei 3-106027, it is described that an etching stopper film is provided on a plurality of gate electrodes arranged adjacent to a memory cell region, respectively, an interlayer insulating film is formed on the whole surface thereof so as to cover the etching stopper film and side faces of the gate electrodes, and a contact hole is fabricated in the interlayer insulating films among those plurality of gate electrodes. According to this disclosure, the contact hole is formed in a self-alignment manner with the etching stopper film on the gate electrodes as a mask, and sidewall films are formed by remaining a part of the interlayer insulating film are formed on the side faces of the gate electrodes, thereby to insulate the gate electrodes and the contact hole from each other. In such a fabricating method, since the sidewall films composed of the interlayer insulating film are liable to be removed or the gate electrodes are liable to be exposed in the contact hole, it is impossible to sufficiently suppress generation of short-circuit between the gate electrode and the contact hole.

SUMMARY OF THE INVENTION

Accordingly, it is an object of the present invention to provide an improved method of fabricating a self-aligned contact hole.

A method of fabricating a semiconductor device according to the first feature Of the present invention comprises the steps of: forming a plurality of wirings on a semiconductor substrate, forming sidewall films on the side faces of the plurality of wirings, forming an interlayer insulating film covering the plurality of wirings and the sidewall films, and removing the interlayer insulating films among the wirings and the sidewall films so as to fabricate a contact hole by making the etching rate of the sidewall films substantially equivalent to or higher than the etching rate of the interlayer insulating films.

A method of fabricating a semiconductor device according to the second feature of the present invention comprises the steps of: forming a plurality of wirings on a semiconductor substrate, forming an etching stopper film on the plurality of wirings, forming sidewalls on the side faces of the plurality of wirings, forming an interlayer insulating film covering the plurality of wirings and the sidewall films, and forming a contact hole in the interlayer insulating film among the plurality of wirings, in which the contact hole is formed by making the etching rate of the etching stopper film lower than the etching rate of the interlayer insulating film and the etching rate of the sidewall film substantially equivalent to or higher than the etching rate of the interlayer insulating film.

According to the first feature of the present invention, since the interlayer insulating film among the plurality of wirings and the sidewall films are removed thereby to form a contact hole by making the etching rate of the sidewall film substantially equivalent to or higher than the etching rate of the interlayer insulating film, the etching time of the sidewall films becomes shorter, thus making it possible to shorten the etching time required for fabricating the contact hole.

Furthermore, according to the second feature of the present invention, since the contact hole is formed by making the etching rate of the etching stopper film lower than the etching rate of the interlayer insulating film and the etching rate of the sidewall film substantially equivalent to or higher than the etching rate of the interlayer insulating film, the etching time of the sidewall films becomes shorter, and the time when the etching stopper film is exposed to an etchant can also be shortened. With this, the undesirable etching quantity of the etching stopper film by the etchant can be reduced. Thus, it is possible to prevent poor insulation between the wirings and the contact hole from generating. Therefore, while thinning the etching stopper film formed on the plurality of wirings, poor insulation between the plurality of wirings and the contact hole can be eliminated with reducing the depth of the formed contact hole.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Next, prior to description of the embodiments of the present invention, a method of fabricating a self-aligned contact hole will be explained assuming a case that it is applied to a 256 megabit DRAM with reference to FIG. 1(a) to FIG. 1(f).

Figure 1A:
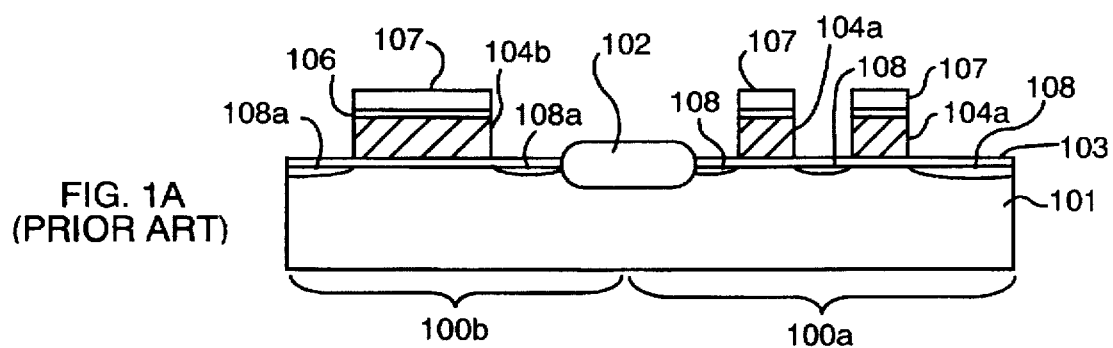
FIG. 1(a) to FIG. 1(f) are sectional views in the order of fabricating process for explaining a prior art.

As shown in FIG. 1(a), an isolating insulator film 102 is formed on a surface of a silicon substrate 101. Further, a memory cell portion 100a and a peripheral circuit portion 100b of a DRAM are separated electrically. Next, a gate insulating film 103 is formed. Here, this gate insulating film is a silicon oxide film having a film thickness of approximately 8 nm. In the memory cell portion 100a, a plurality of memory cells each composed of one piece of transistor and one piece of capacitor are arranged. The peripheral circuit portion 100b is composed of a CMOS circuit using both n-type and p-type transistors, in which a transistor of a lightly doped drain (LDD) structure is adopted for the purpose of improvement of transistor performance. Gate electrodes 104a of a transfer transistor formed in the memory cell portion 100a are formed of tungsten polycide or titanium polycide, and has a dimension of approximately 0.25 µm. These gate electrodes 104a are word lines of this memory device. Further, the spacing between adjacent gate electrodes 104a is approximately 0.2 to 0.25 µm. Furthermore, the film thickness of these gate electrodes 104a is also approximately 0.2 to 0.25 µm. The dimension of the gate electrode 104b of a CMOS transistor formed in the peripheral circuit portion 100b generally becomes larger than the dimension of the gate electrode of the transfer transistor in the memory cell portion and is set to approximately 0.4 µm. A buffer layer 106 and an etching stopper layer 107 are formed by lamination on these gate electrodes 104a and 104b. Then, shallow diffused layers 108 and 108a forming a source and a drain of the MOS transistor are formed. Here, the concentrations of impurities in these shallow diffused layers 108 and 108a are set to approximately $1\times10^{18}$ atoms/cm$^3$.

Figure 1B:
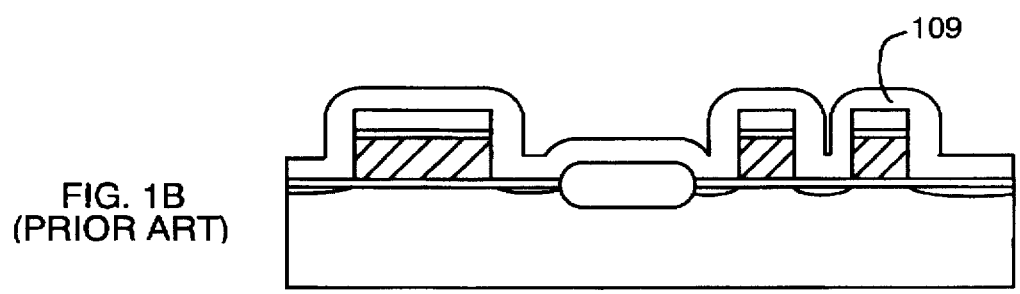

Next, a covering insulator film 109 having a film thickness of 100 to 150 nm is deposited so as to cover the whole surface as shown in FIG. 1(b). Here, the covering insulator film 109 is an SiO$_2$ film formed by a well-known chemical vapor deposition (CVD) method.

Figure 1C:
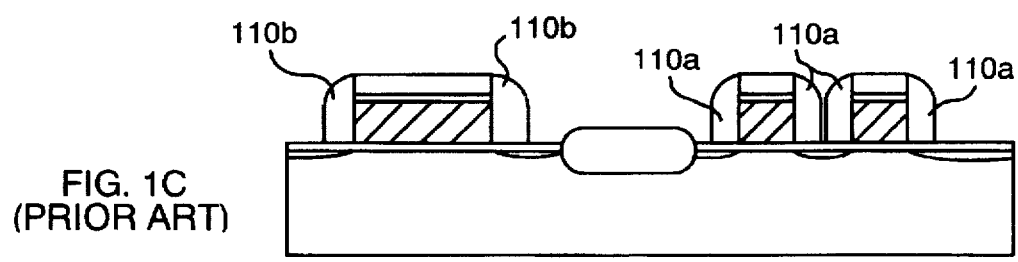

Next, this covering insulator film 109 is etched all over the surface by anisotropic reactive ion etching (RIE) (hereinafter referred to as etching-back). Sidewall layers 110a and 110b are formed on the sidewalls of the gate electrodes 104a and 104b by such etching-back as shown in FIG. 1(c). This sidewall layer 110b is used as a mask for ion implantation for forming a deep diffused layer 108b at a separated location from the end portion of the gate electrode 104b, and the film thickness of this sidewall layer 110b is set to 100 to 150 nm.

Next, n-type impurities are introduced again into shallow diffused layers only of the CMOS transistor in the peripheral circuit portion 100b by well-known selective ion implantation using resist not shown as a mask, and heat treatment is applied thereto thereby to form the deep diffused layer 108b. Here, the impurity concentration of this deep diffused layer 108b is set to $1\times10^{19}$ to $1\times10^{20}$ atoms/cm$^3$. As stated above, the diffused layer of the source and the drain of the CMOS transistor in the peripheral circuit portion shows a well-known lightly doped drain (LDD) structure.

Figure 1D:
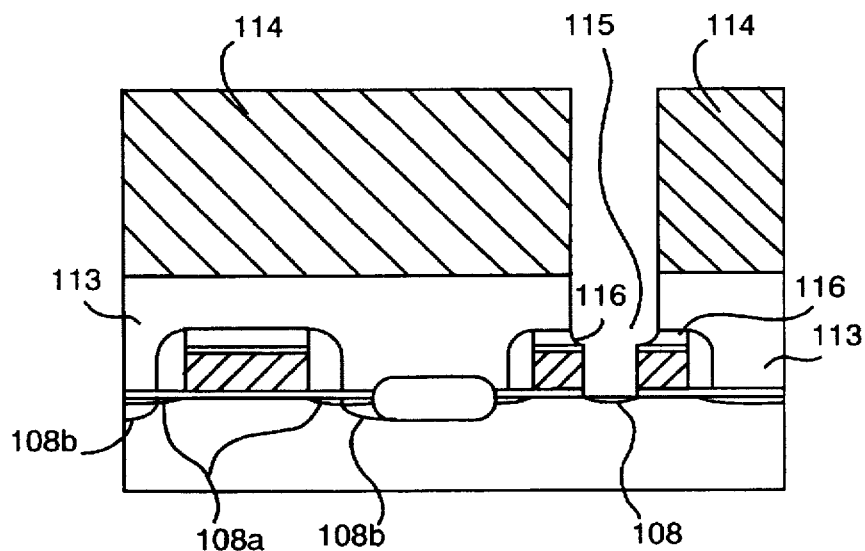

Next, as shown in FIG. 1(d), an interlayer insulating film 113 such as a silicon oxide film (a BPSG film) containing boron and phosphorus is deposited all over the surface, thereby to flatten the difference in level produced by the gate electrodes 104a and 104b or the like. Then, a contact hole 115 is opened with a resist pattern 114 as a mask. For this etching, an etching stopper film 116 and a selective etching method are used. For example, it has been known that, when the etching stopper film 116 is a silicon nitride film, it is possible to apply dry etching selectively to the silicon oxide film with respect to the silicon nitride film by using mixed gas of carbon fluoride and carbon monoxide. In this case, an etching selection ratio of a silicon oxide film to a silicon nitride film of 5:1 to 15:1 has been obtained.

Figure 1E:
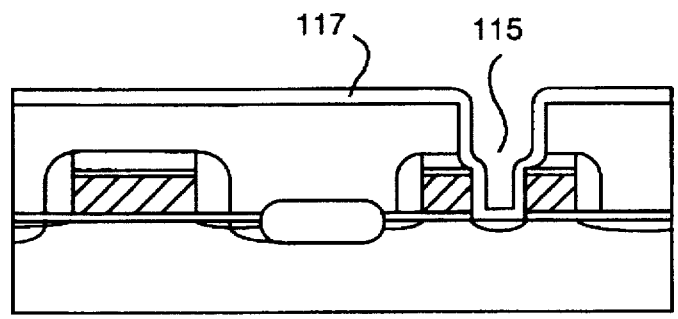
Figure 1F:
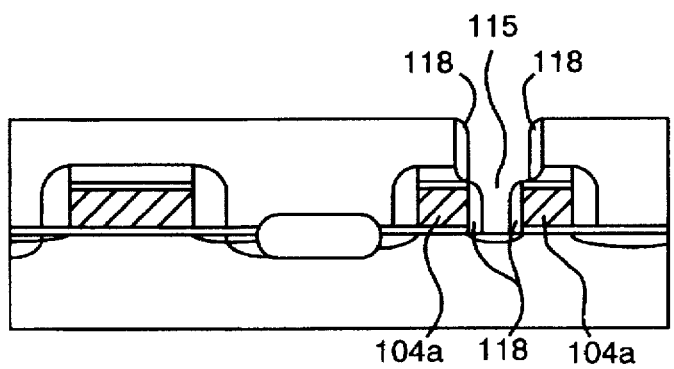

Since the etching stopper film 116 only covers the top portion of the gate electrode 104a, the sidewall of the gate electrode 104a is exposed to the contact hole 115 after the contact hole etching. Therefore, an insulator film 117 such as a silicon oxide film is deposited as shown in FIG. 1(e) after the resist pattern 114 is peeled off. Furthermore, as shown in FIG. 1(f), a second sidewall layer 118 is formed on the sidewall of the contact hole 115 and the sidewall of the gate electrode 104a by anisotropic etching. In such a manner, it is possible to obtain the contact hole 115 insulated in a self-alignment manner from the gate electrode 104a.

However, it is considered that new problems such as described hereunder are produced in a conventional method described above.

The film thickness of the sidewall layer 110b used for forming a transistor having an LDD structure in the peripheral circuit 100b exerts an influence directly upon transistor characteristics and reliability. Since this film thickness is determined by a diffusion coefficient of impurities and heat treatment temperature and time in a process of fabricating a device, it is not easy to reduce the film thickness corresponding to the refinement of the device. In particular, since boron having a large diffusion coefficient is used as the impurities of the source and the drain of a p-type transistor, the film thickness is also designed at 100 to 200 nm in 256M and 1 G DRAMs. Since it is not required for the transistor in the memory cell portion 100a of the memory device to have an LDD structure, the sidewall layer 110a is unnecessary for the transistors. When the sidewall layer 110b is formed, however, the sidewall layer 110a is formed inevitably. Since the spacing between the gate electrodes 104a of such a degree of integration is 0.15 to 0.25 µm, the spacing between the gate electrodes 104a is almost filled up with the sidewall layer 110a. Namely, the spacing between adjacent word lines is filled up with the sidewall layer 110a. In order to open a contact hole 115 between such word lines, the sidewall layer 110a has also to be etched in addition to an interlayer insulating film 113. However, an HTO film used as the sidewall layer 110a generally has an etching rate approximately half to one-third as compared with that of the BPSG film. Therefore, the etching period from the time when the etching stopper layer 116 above the word lines is exposed to the contact hole 115 until the diffused layer 108 is exposed is protracted. As a result, an etching stopper film 107 above the wiring that has been exposed to an etching atmosphere for a long period of time is etched from a corner portion of low selectivity and becomes a thinned etched stopper layer 116 as shown in FIG. 1(d), which causes poor insulation between the contact hole 115 and the word lines 104a. It is also thinkable to prevent the poor insulation by forming the etching stopper film 107 thick in advance. When the etching stopper layer 107 is made thicker as described above, however, the difference in level produced by the word lines 104a and the etching stopper film 107 becomes larger, and the depth of the contact hole 115 has to be increased further. When the contact hole 115 becomes deeper, such another problem is generated that opening becomes more difficult to be formed and flattening is deteriorated, thus deteriorating coverage of a film formed thereafter.

Next, a first embodiment of the present invention will be described assuming a case that it is applied to a 256 megabit DRAM with reference to the drawings.

Figure 2A:
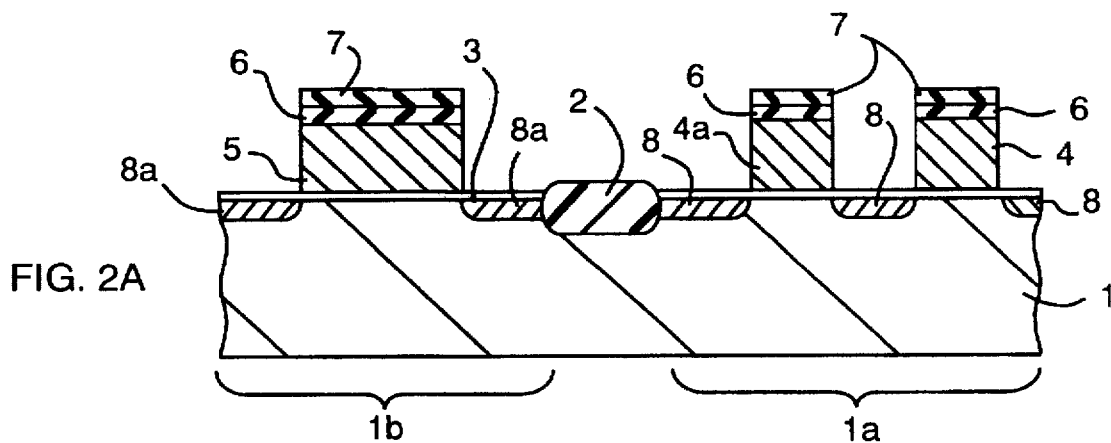
FIG. 2(a) to FIG. 2(g) are sectional views in the order of fabricating process for explaining a first embodiment of the present invention.

As shown in FIG. 2(a), an isolating insulator film 2 is formed on a surface of a p-type silicon substrate 1 to divide the substrate 1 into a memory cell portion 1a and a peripheral circuit portion 1b of the DRAM. The two portions 1a and 1b are isolated electrically by the insulator film 2. Next, a gate insulating film 3 is formed on a surface of the substrate 1. Here, this gate insulating film 3 is a silicon oxide film or a silicon oxynitride film having a film thickness of approximately 6 to 8 nm. After the above-described arrangement is made, a plurality of MOS transistors, i.e., transfer transistors is formed in the memory cell portion 1a. Furthermore, a CMOS transistor is formed in the peripheral circuit portion 1b.

Next, a refractory metal polycide such as a titanium polycide film having a film thickness of approximately 0.2 μm is formed all over the surface, a silicon oxide film having a film thickness of approximately 10 μm is formed further all over the surface, and furthermore, a silicon nitride film having a film thickness of approximately 50 nm is formed all over the surface. Next, by applying patterning successively to these silicon nitride film, silicon oxide film and titanium polycide film, an etching stopper layer 7 made of the silicon nitride film, a buffer layer 6 made of the silicon oxide film and gate electrodes 4, 4a and 5 made of the titanium polycide film are formed, respectively. The dimension of each of the electrodes 4 and 4a formed in the memory cell portion 1a is approximately 0.2 μm. Further, the spacing between adjacent gate electrode 4 and gate electrode 4a is approximately 0.2 μm. The gate electrodes 4 and 4a formed in this memory cell portion 1a are word lines of this DRAM. The dimension of the gate electrode 5 formed in the peripheral circuit portion 1b is larger than the dimensions of the gate electrodes 4 and 4a formed in the memory cell portion 1a and is set to approximately 0.4 μm. Next, impurities are introduced into the semiconductor substrate 1 with the etching stopper layer 7, the buffer layer 6 and the gate electrodes 4, 4a and 5 as the mask, thus forming n-type shallow diffused layers 8 and 8a constituting the source and the drain of the MOS transistor. Here, the impurity concentration of these shallow diffused layers 8 and 8a is set to approximately $1 \times 10^{18}$ atoms/cm$^3$.

Figure 2B:
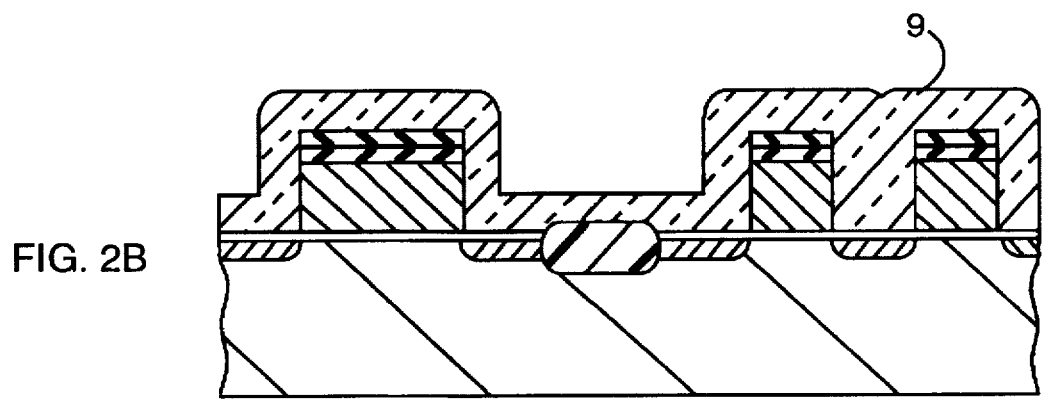

Next, in the present embodiment, a first covering insulator film 9 having a film thickness of 150 nm is deposited so as to cover the whole surface as shown in FIG. 2(b). Here, a PSG film (a silicon oxide film containing phosphorus glass) by a low-pressure chemical vapor deposition (LPCVD) method is used as an example of the first covering insulator film 9. Further, the concentration of the phosphorus atoms contained in this PSG film is approximately 10 mol %.

Figure 2C:
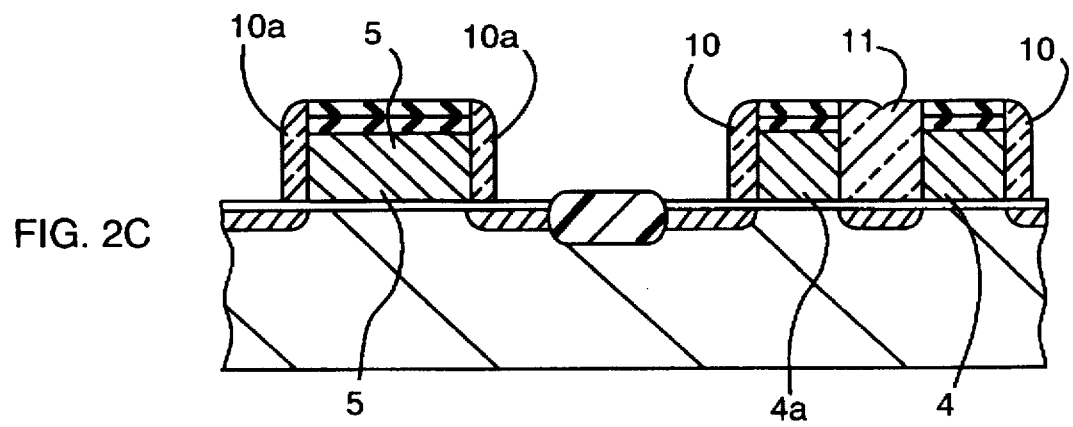

Next, anisotropic etching-back is applied to the first covering insulator film 9. Here, this etching-back is performed by an RIE method using mixed gas of $C_4F_8$ and CO as the reaction gas. With such etching-back, first sidewall layers 10 and 10a are formed on the sidewalls of the gate electrodes 4, 4a and 5 as shown in FIG. 2(c). Here, the film thickness of the first sidewall layers 10 and 10a is set to 100 nm. With the process of this etching-back, along with the formation of the first sidewall layers 10 and 10a described previously, an embedded insulating layer 11 composed of the first sidewall layers 10 is left between the gate electrodes 4 and 4a located at short separation distance in the memory cell portion 1a.

Figure 2D:
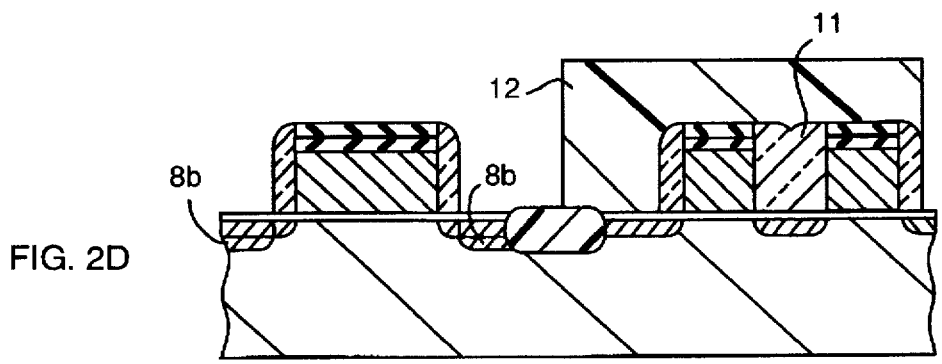
Figure 2E:
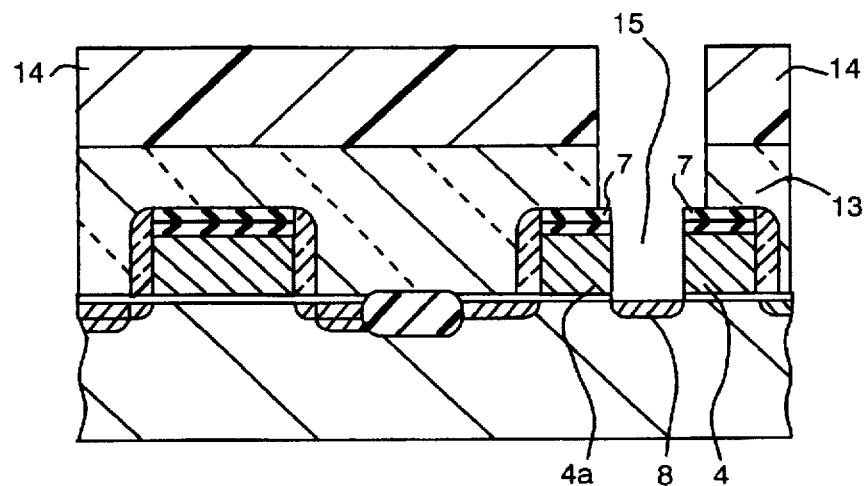

Next, as shown in FIG. 2(d), a resist mask 12 for ion implantation is formed by a well-known lithography technique. Further, n-type impurities are introduced again into the shallow diffused layer 8a of the MOS transistor in the peripheral circuit portion 1b by well-known selective ion implantation using the resist mask 12 as the mask, and heat treatment is applied thereto, thereby to form an n-type deep diffused layer 8b. Here, the impurity concentration of the deep diffused layer 8b is set to $1 \times 10^{19}$ to $1 \times 10_{\sim}$atoms/cm$^3$. In such a manner, the N-channel MOS transistor in the peripheral circuit portion 1b is formed to have an LDD structure, in which the source and drain regions are formed of the diffused layers 8a and 8b.

Next, after removing the resist mask 12, an interlayer insulating film 13 is formed all over the surface so as to flatten the difference in level produced by the gate electrodes 4, 4a and 5 or the like. Here, this interlayer insulating film 13 is a BPSG film (a silicon oxide film containing boron glass and phosphorus glass) having a film thickness of 400 nm. The concentrations of boron and phosphorus atoms contained in this BPSG film in this case are set to, for example, approximately 5 mol % and 10 mol % in mol concentration, respectively. Next, a resist mask 14 for a contact hole is formed by patterning into a predetermined configuration. Then, the interlayer insulating film 13, the embedded insulating layer 11 composed of the sidewall layers and the gate insulating film 3 on the surface of the diffused layer 8 are etched using the resist mask 14 as a mask for dry etching. In this manner, the contact hole 15 is formed. Here, since the etching stopper layer 7 has been formed on the gate electrodes 4 and 4a, the contact hole 15 is formed on the diffused layer 8 by self-alignment with the gate electrodes 4 and 4a as described previously. In the dry etching of the interlayer insulating film 13 and the embedded insulator layer 11, it is more desirable to increase the etching rate ratio of the interlayer insulating film 13 and the embedded insulator layer 11 to the etching stopper layer 7. Therefore, the gas obtained by mixing CO with $C_4F_8$ is used as the reaction gas in the dry etching of RIE. By selecting such gas, this etching rate ratio becomes about 20, and the roles of the etching stopper layer 7 as the etching mask are secured.

Figure 2F:
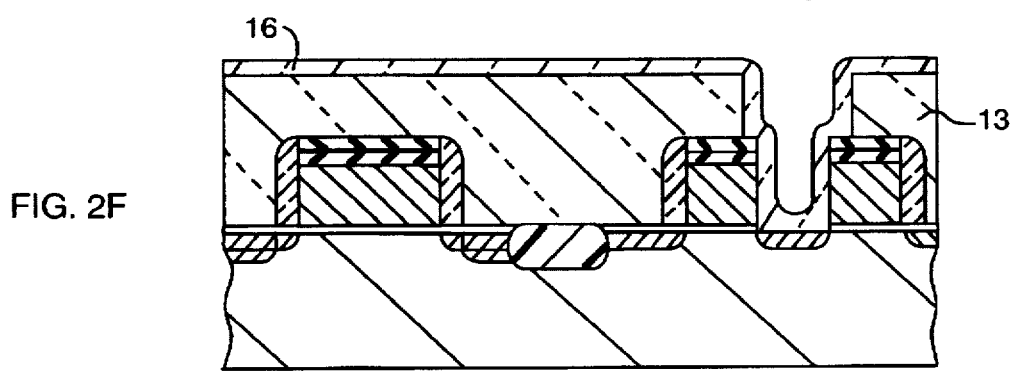

Next, as shown in FIG. 2(f), a second covering insulator film 16 is deposited all over the surface so as to cover the contact hole 15 and the interlayer insulating film 13 described above. Here, the second covering insulator film 16 is a silicon oxide film having a film thickness of approximately 60 nm. This silicon oxide film is, for example, an HTO film, which is superior in the performance of covering the difference in level, formed by a CVD method at a film forming temperature as high as approximately 800° C.

Figure 2G:
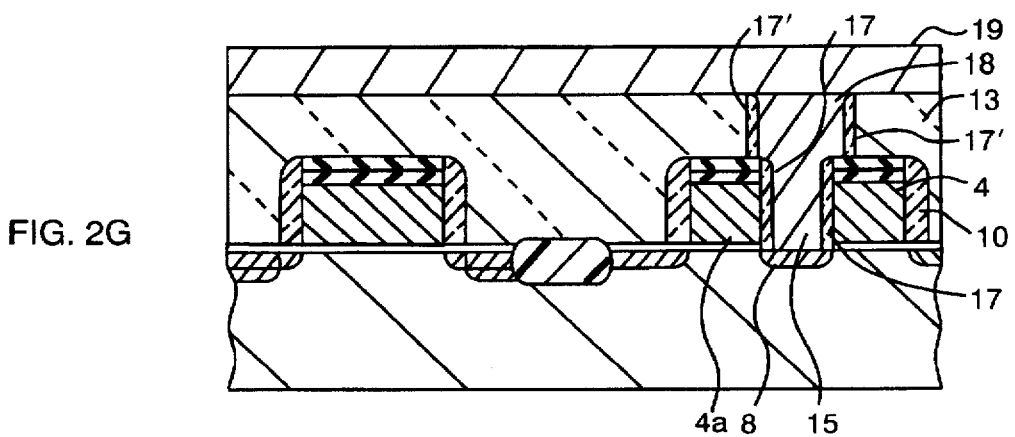

Next, etching-back on the whole surface of the second covering insulator film 16 is performed. Here, in the etching-back, for example, a mixed gas of $CHF_3$ and CO or a mixed gas of $C_4F_8$ and CO is used as the reaction gas of anisotropic RIE. In such a manner, a second sidewall layer 17 is formed on the sidewall portions of the gate electrodes 4 and 4a of the transfer transistor in the memory cell portion as shown in FIG. 2(g). Further, a sidewall layer 17' is also formed on the sidewall portion of the contact hole 15 formed in the interlayer insulating film 13. The film thickness of the second sidewall layer 17 in this case is approximately 50 nm. Further, the final dimension of the contact hole is approximately 100 nm.

As described above, the first sidewall layer 10a having a film thickness of 100 nm is formed on the sidewall of the gate electrode 5 of the MOS transistor in the peripheral circuit portion 1b, the second sidewall layer 17 is formed on the sidewalls of the gate electrodes 4 and 4a of the transfer transistor in the memory cell portion 1a, and a contact hole 15' self-aligned with the gate electrodes 4 and 4a having the second sidewall layer 17 is formed on the diffused layer 8.

Next, a polycrystalline silicon plug 18 doped with impurities embedded in the contact hole 15' is formed. The plug 18 can be formed by selective deposition method of polycrystalline silicon in the hole 15' or by blanket CVD method followed by etching-back method. Next, a refractory metal silicide film such as tungsten silicide film 19 having a thickness of approximately 0.15 μm is formed to cover the interlayer insulating film 13 and the polycrystalline silicon plug 18 as shown in FIG. 2(g). The tungsten silicide film 19 serves as a digit line of the DRAM. The tungsten silicide film 19 is connected to the diffused layer 8 located between the gate electrodes 4 and 4a via the silicon plug 18. That is, the digit line is connected to the diffused layer 8 via the self-aligned contact hole 15'.

According to the present embodiment, a PSG film of a material quality having an etching rate substantially equivalent to or higher than the etching rate of the BPSG film forming the interlayer insulating film 13 is adopted for the first sidewall layers 10 and 10a. Thus, it is arranged so that, when the etching of the interlayer insulating film 13 for forming the contact hole 15 is completed, the embedded insulator film 11 composed of the first sidewall layer 10 is also removed. With this, the etching time required for forming the contact hole 15 can be shortened. Furthermore, since the embedded insulator film 11 composed of the first sidewall layer 10 is also made to be removed when the etching of the interlayer insulating film 13 for forming the contact hole 15 is terminated, it is possible to shorten the period that the etching stopper layer 7 is exposed to the etchant to form the contact hole 15. With this, it is possible to prevent the decrease in film thickness of the etching stopper layer 7. By preventing the decrease in film thickness, it is possible to prevent generation of poor insulation from the contact hole 15 at the corner portions of the gate electrodes 4 and 4a constituting the word lines. Furthermore, since it becomes possible to reduce the decrease in film thickness of the etching stopper layer 7 according to the present embodiment, it is possible to thin the film thickness of the etching stopper layer 7 that is formed in advance on the gate electrodes 4 and 4a. By forming the etching stopper layer 7 thin in thickness, it is possible to reconcile to make the depth of the contact hole 15 shallower and to prevent generation of short-circuit problems between the gate electrodes 4 and 4a constituting the word lines and the contact hole 15. Therefore, undesirable short-circuit problem between the word lines and the digit line can be resolved.

Besides, in the present embodiment, a PSG film is selected as the first sidewall layer 10 for the interlayer insulating film 13 of the BPSG film. When a silicon oxide film containing impurities such as a PSG film, a BSG film, a BPSG film or a laminated film thereof is used for the interlayer insulating film 13, a silicon oxide film containing impurities such as the PSG film, the BSG film, the BPSG film or the laminated film thereof can be used for the first sidewall layer 10, and the etching rate of the first sidewall layer can be made substantially equivalent to or higher than the etching rate of the interlayer insulating film 13. Especially, when a BPSG film is selected as the first sidewall layer 10 for the interlayer insulating film 13 made of a PSG film, the etching rate of the first sidewall layer can be made higher than that of the interlayer insulating film 13 against common etchant for the contact hole formation.

In the present embodiment, the tungsten silicide film 18 serving as the digit line is connected to the diffused layer 8 via the silicon plug 18 embedded in the contact hole 15'. Because the contact hole 15' used in the 256 megabit DRAM is fine, a metal film is difficult to deposit in the contact hole 15' to connect to the diffused layer 8. Therefore, if a contact hole is not so fine, it is thinkable that a digit line having a polycide structure is formed to cover a surface of the interlayer insulating film 13, the second sidewall layer 17 and 17', and the diffused layer 8 to connect to the diffused layer 8. In this case, a polycrystalline silicon film is formed thinly on the surface of the insulating film 13, the sidewall layer 17 and 17', and the diffused layer 8, followed by forming a tungsten silicide film thinly on a surface of the polycrystalline silicon film.

Figure 3A:
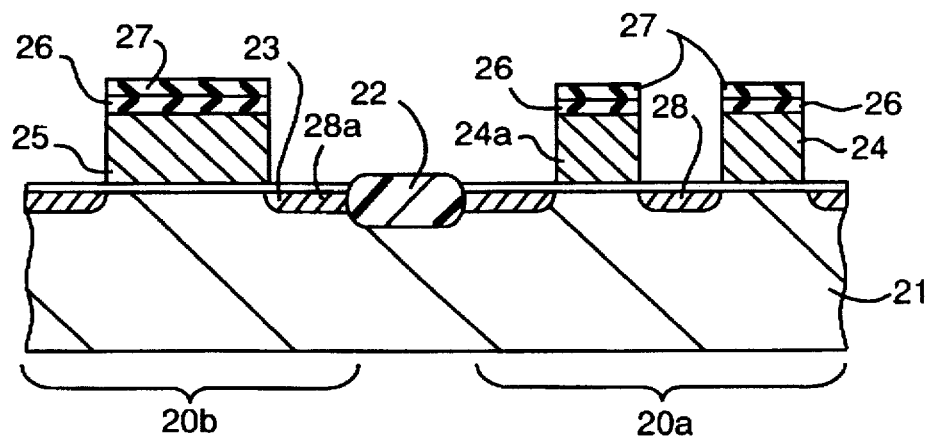
FIG. 3(a) to FIG. 3(g) are sectional views in the order of fabricating process for explaining a second embodiment of the present invention.

Next, a second embodiment will be described based on FIG. 3. As shown in FIG. 3(a), an isolating insulator film 22 is formed on a silicon substrate 21. Then, a gate insulating film 23 is formed. Here, this gate insulating film 23 is a silicon oxide film or a silicon oxynitride film having a film thickness of approximately 8 nm. After the above-mentioned arrangement is made, a plurality of MOS transistors, i.e., transfer transistors are formed in a memory cell portion 20a. Furthermore, a CMOS transistor is formed in a peripheral circuit portion 20b. Gate electrodes 24 and 24a of the transfer transistor formed in the memory cell portion 20a are formed of titanium polycide, and the dimension thereof is 0.15 to 0.2 μm. These gate electrodes 24 and 24a are word lines of the memory device. Further, the spacing between adjacent gate electrodes 24 and 24a is set to approximately 0.2 μm. Furthermore, the film thickness of these gate electrodes 24 and 24a is also set to approximately 0.2 μm. The dimension of a gate electrode 25 of the MOS transistor formed in the peripheral circuit portion 20b generally becomes larger than the dimensions of the gate electrodes 24 and 24a of the transfer transistor in the memory cell portion 20a, and is set to approximately 0.3 μm. A buffer layer 26 is formed covering the gate electrodes 24, 24a and 25 described previously, and furthermore, an etching stopper layer 27 covering the buffer layer 26 is formed. Here, the buffer layer is a silicon oxide film having a film thickness of approximately 10 nm, and the etching stopper layer 27 is a silicon oxide film containing excessive silicon (hereinafter referred to as an SRO film) having a film thickness of approximately 50 nm.

Now, a method of fabricating an SRO film will be described briefly hereinafter. This method of fabricating an SRO film is basically the same as a method of forming a silicon dioxide film by a CVD method. Namely, in an LPCVD furnace for heating a pressure reducible quartz reaction tube with a heater, the temperature of the furnace is set to 700° C. to 800° C., and the gas of monosilane and nitrogen oxide is introduced into the furnace through different gas inlets, respectively, as the reaction gas. Here, nitrogen gas is used for ambient gas and the total pressure of the gas is set to approximately 1 Torr. In this method of forming a film, excessive silicon is made to be contained in the silicon dioxide film. For such a purpose, the gas flow rate ratio of monosilane to nitrogen oxide is varied, thereby to increase the gas flow rate of monosilane. Here, as the gas flow rate ratio of monosilane gets higher, the excessive silicon quantity is increased. Thus, a thin film of silicon oxide containing excessive silicon, i.e., the SRO film is formed. This SRO film is an insulator having a structure that microscopic silicon aggregate is mixed into a silicon dioxide ($SiO_2$) film.

Next, shallow diffused layers 28 and 28a constituting the source and the drain of the MOS transistor are formed similarly to the first embodiment. Here, the impurity concentration of these shallow diffused layers 28 and 28a is set to approximately $1 \times 10^{18}$ atoms/cm$^3$.

Figure 3B:
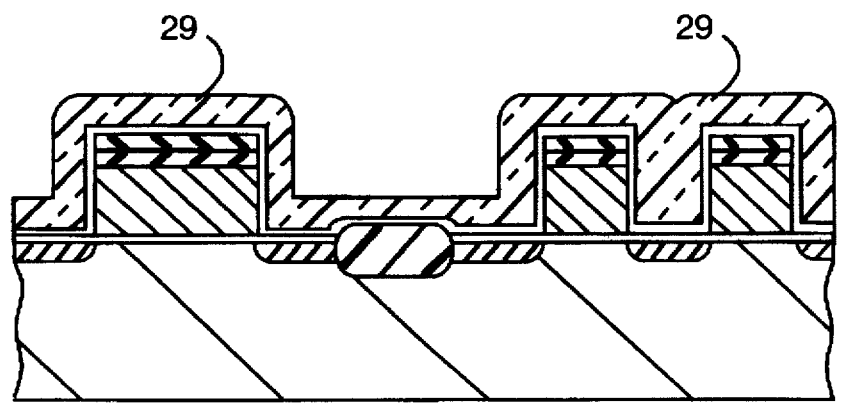

A coating insulator film 29' having a film thickness of 5 nm to 10 nm is deposited so as to cover the whole surface as shown in FIG. 3(b). Here, this coating insulator film 29' is a silicon oxide film formed by a CVD method. Furthermore, for example, a BPSG film by an LPCVD method is formed as the first covering insulator film 29 covering the coating insulator film 29'. Here, the concentration of phosphorus atoms contained in the BPSG film is approximately 8 mol %, and the content of boron atoms is approximately 3 mol %. Further, the film thickness of the BPSG film is set to approximately 200 nm.

Figure 3C:
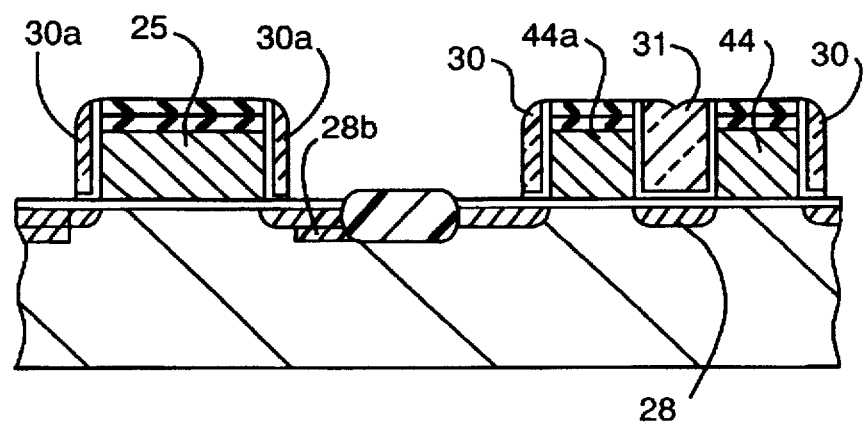

Next, anisotropic etching-back by RIE is applied. Here, mixed gas of $C_4F_8$ and CO is used for the reaction gas of RIE. With such etching-back, first sidewall layers 30 and 30a are formed on the sidewalls of gate electrodes 24, 24a and as shown in FIG. 3(c). Here, the first sidewall layer is composed of the coating insulator film 29' and the first covering insulator film 29 described previously each having a film thickness of 5 to 10 nm and the whole film thickness thereof is set to show approximately 150 nm. In this etching-back process, an embedded insulator layer 31 is formed between gate electrodes 24 and 24a at a short separation distance in the memory cell portion 2a along with the formation of the first sidewall layers. Here, the embedded insulator layer 31 is composed of the first sidewall layer, formed by adjacent first sidewall layers being integrated with each other, and is constituted with the coating insulator layer 29' and the first covering insulator layer 30.

Figure 3D:
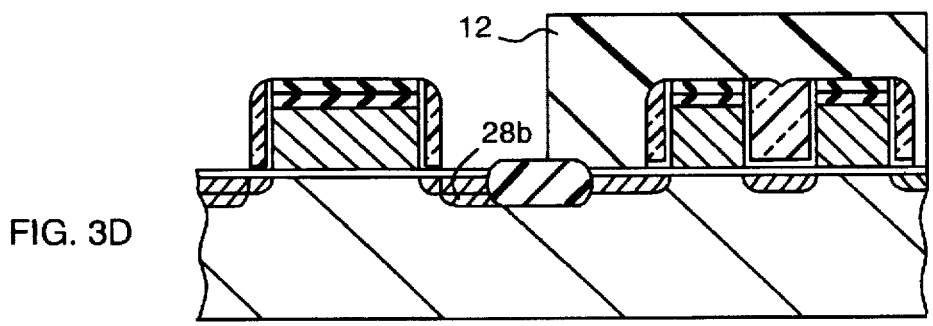

Next, a resist mask 12 covering the memory cell portion 20a is formed as shown in FIG. 3(d). Next, ion implantation is performed with this pattern 12 as a mask so as to introduce impurities into the shallow diffused layer 28a of the MOS transistor in the peripheral circuit portion 20b and heat treatment is applied thereto, thereby to form a deep diffused layer 28b. With this, the MOS transistor in the peripheral circuit portion 20b shows an LDD structure in which the source and drain region is composed of the shallow diffused layer 28a and the deep diffused layer 28b.

Figure 3E:
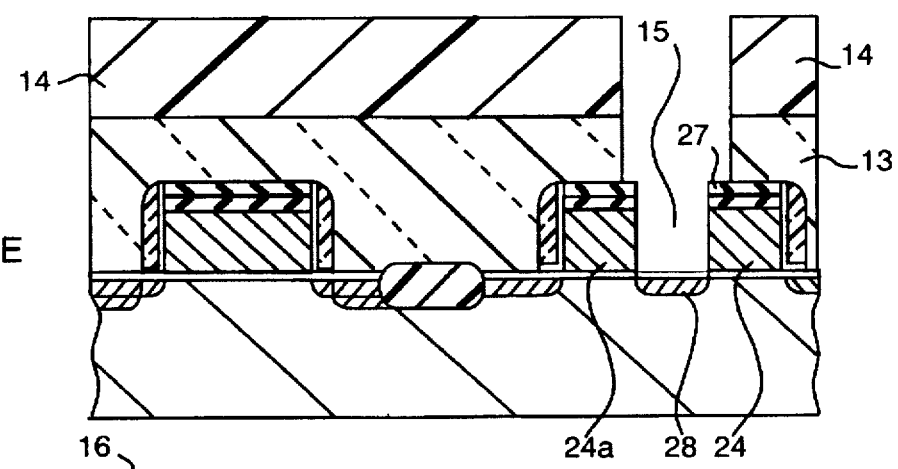

Next, after the resist mask 12 is removed, the interlayer insulating film 13 is formed all over the surface, thus flattening the difference in level produced by the gate electrodes 24, 24a and 25 or the like. Here, a BPSG film is used as the interlayer insulating film 13 similarly to the first embodiment. Next, a resist film is formed on the interlayer insulating film 13 and patterning is applied thereto, thereby to form a resist mask 14 for forming a contact hole. Next, as shown in FIG. 3(e), the interlayer insulating film 13 and the embedded insulator layer 31 composed of the coating insulator film 29' and the first covering insulator film 29 are etched using the resist mask 14 as a mask. With this, the contact hole 15 is formed. Here, since an etching stopper layer 7 has been formed on the gate electrodes 24 and 24a, respectively, the contact hole 15 is formed being self-aligned with the gate electrodes 24 and 24a. Here, the coating insulator film 29' is formed of a silicon oxide film having an etching rate lower than that of the interlayer insulating film 13. However, the film thickness thereof is approximately one-tenth of the spacing between the gate electrodes 4 and 4a. Therefore, the embedded insulator layer 31 is almost buried with a BPSG film having a high etching rate. Thus, although the period when the etching stopper layer 7 is exposed to the etchant becomes longer than the first embodiment when the contact hole 15 is formed, but it can be made shorter than the prior art.

Figure 3F:
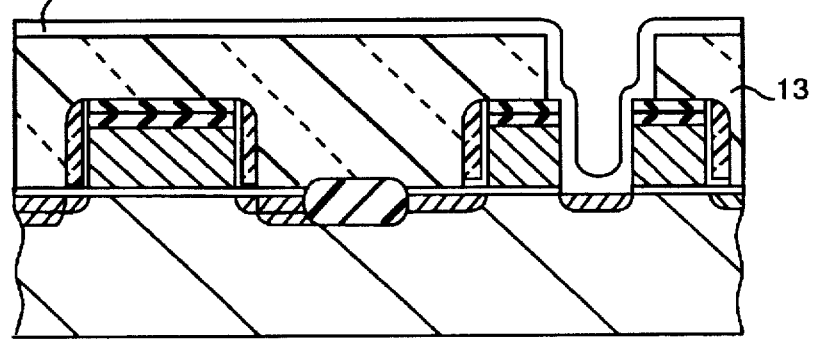
Figure 3G:
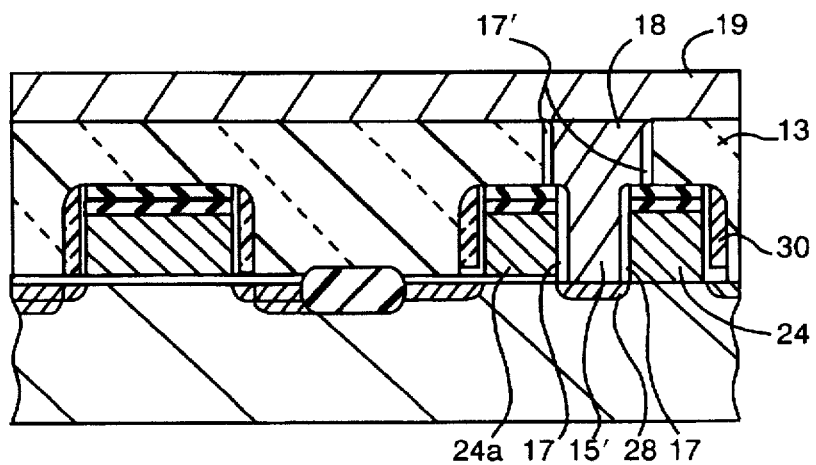

Next, as shown in FIG. 3(f), a second covering insulator film 16 is deposited all over the surface so as to cover the contact hole 15 and the interlayer insulating film 13. This second covering insulator film 16 is assumed, for example, to be an HTO film similarly to the first embodiment. Then, the second covering insulator film 16 is etched back so that, as shown in FIG. 3(g), a second sidewall layer 17 is formed on the sidewalls of the gate electrodes 4 and 4a, a sidewall layer 17' is also formed on the inner wall of the contact hole 15 formed in the interlayer insulating film 13, and a contact hole 15' is formed finally. After forming the contact hole 15', a digit line is formed to connect to the diffused layer 8 via the contact hole 15' as the same manner as the first embodiment, as shown in FIG.3(g).

In the present embodiment, the first sidewall layers 30 and 30a and the embedded insulator layer 31 are formed of the coating insulator film 29' and the first covering insulator film 29. Namely, the coating insulator film 29' is formed between the first covering insulator film 29 and the gate electrodes 24, 24a and 25 and the gate insulating film 23. Furthermore, this coating insulator film 29' is formed of an impurity non-doped silicon oxide film having a film thickness of approximately one-tenth of the spacing between the gate electrodes 4 and 4a. Furthermore, the first covering insulator film 29 is formed of a BPSG film, and the greater part of the first sidewall layers 30 and 30a and the embedded insulator layer 31 are formed of the BPSG film. Thus, when the etching for forming the contact hole 15 of the interlayer insulating film 13 composed of the BPSG film is terminated, the embedded insulator film 31 composed of the first sidewall layer 30 is also made to be removed. With this, although the etching period required for forming the contact hole 15 becomes longer than the first embodiment to some extent, the etching period can be made shorter than the prior art. Furthermore, since the embedded insulator film 31 composed of the first sidewall layer 30 is also made to be removed when the etching of the interlayer insulating film 13 for forming the contact hole 15 is terminated, it is possible to shorten the period when the etching stopper layer 7 is exposed to the etchant. With this, it is possible to prevent the reduction in film thickness of the etching stopper layer 7. By preventing the reduction in film thickness, it is possible to prevent generation of poor insulation between the gate electrodes 24 and 24a constituting the word lines and the contact hole 15'. Therefore, short-circuit between the word lines and the digit line is eliminated. Furthermore, since it becomes possible to decrease the reduction in film in the etching stopper layer 7 according to the present embodiment, it is possible to reduce the film thickness of the etching stopper layer 7 that is to be formed on the gate electrodes 24 and 24a. With this, it is possible to reconcile to make the depth of the contact hole 15' shallower by thinning the etching stopper layer 7 and to prevent generation of a short-circuit problem between the gate electrodes 24 and 24a constituting the word lines and the contact hole 15'.

Figure 4:
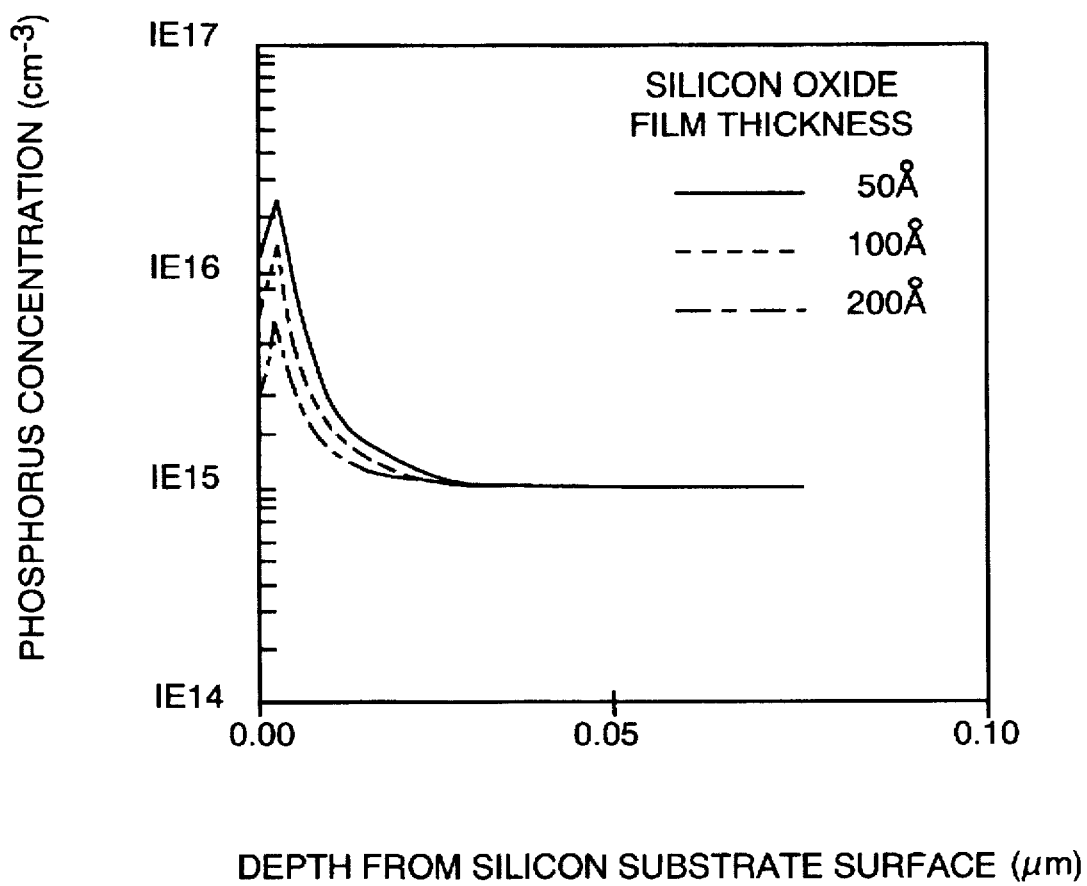
FIG. 4 is a graph showing an admission quantity of phosphorus impurities into a silicon substrate from a PSG film.

Furthermore, in the present embodiment, it is also possible to prevent impurity diffusion from an impurity-doped silicon oxide film such as a BPSG film forming the first covering insulator film 29 into the semiconductor substrate 21 by the fact that the coating insulator film 29' has been provided. The reason will be described with reference to FIG. 4. FIG. 4 is a graph showing thermal diffusion of phosphorus from a PSG film of 10 mol % concentration to the silicon substrate. Here, this shows the case that a silicon oxide film having a film thickness of 5 to 20 nm has been formed between the PSG film and the silicon substrate, and heat treatment has been applied for two hours at 800° C. after the PSG film is deposited. It is seen from FIG. 4 that, even when the silicon oxide film is 5 nm thick, the admission quantity of phosphorus into the silicon substrate is 2E16 $cm^{-3}$, i.e., approximately $2 \times 10^{16}$ atoms/$cm^3$ and the admission depth is 10 nm or less. In a process of fabricating a 256M DRAM, it is assumed that heat treatment for one to two hours at a temperature of 850° C. or higher is performed after the word lines are formed. However, if a silicon oxide film as thin as approximately 10 to 20 nm having the thickness in this order is provided thereunder, the diffusion of impurities from the impurity-doped silicon oxide film into the semiconductor substrate becomes the degree of no problem. Therefore, it makes possible to exert no influence upon transistor characteristics from the impurity-doped oxide film such as a PSG film or a BPSG film. Namely, in the present embodiment, it is also possible to prevent impurity diffusion into the semiconductor substrate 21 from an impurity-doped silicon oxide film such as a BPSG film constituting the first covering insulator film 29, and it becomes possible to prevent variation in transistor characteristics by the fact that the coating insulator film 29' is provided. Namely, it becomes possible to make the depth of the contact hole 15' shallower by forming the etching stopper layer 27 into a thin film, and to prevent variation in transistor characteristics while preventing generation of a short-circuit problem between the gate electrodes 24 and 24a constituting the word lines and the contact hole 15'.

In the case of the second embodiment, the reliability of the formed MOS transistor is improved better than the case of the first embodiment since an SRO film is used for the etching stopper layer. Besides, since a BPSG film is used for the first covering insulator film, the etching rate ratio in the dry etching of the first covering insulator film and the etching stopper layer becomes to be secured at approximately 20, and it is easy to form a highly reliable self-aligned contact hole.

Besides, in the present embodiment, a BPSG film is selected as the first covering insulator film 29 for the interlayer insulating film 13 of the BPSG film. As described in the first embodiment, when a silicon oxide film containing impurities such as a PSG film, a BSG film, or a BPSG film is used for the interlayer insulating film 13, a silicon oxide film containing impurities such as the PSG film, the BSG film, or the BPSG film can be used for the first covering insulator film 29, and the etching rate of the first covering insulator film can be made substantially equivalent to or higher than the etching rate of the interlayer insulating film 13. Especially, when a BPSG film is selected as the first covering insulator film 13 for the interlayer insulating film 13 made of a PSG film, the etching rate of the first covering insulator film can be made higher than that of the interlayer insulating film against common etchant for the contact hole formation.

Figure 5A:
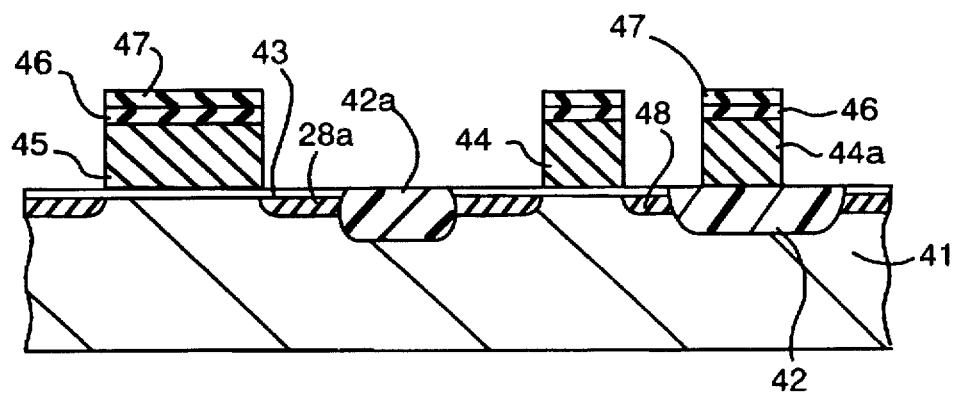
FIG. 5(a) to FIG. 5(f) are sectional views in the order of fabricating process for explaining a third embodiment of the present invention.

Next, a third embodiment will be described on the basis of FIG. 5(a) to FIG. 5(f). In the case of the present embodiment, a method of fabricating a self-aligned contact hole when an isolating insulator film is exposed is shown. As shown in FIG. 5(a), an isolating insulator film 42 is formed in a groove formed on a surface of a silicon substrate 41. This isolating insulator film 42 is formed in such a manner that a groove having a depth of approximately 0.3 µm to 0.8 µm is formed first by well-known dry etching at a predetermined region of the silicon substrate 41, a thin silicon oxide film approximately 2 nm to 5 nm in thickness is provided thereafter on the sidewall of this groove, and then an SRO film is formed being embedded in such a groove. Or, only the SRO film is formed being embedded in the groove.

A process of fabricating a self-aligned contact hole thereafter is similar to the case of the first embodiment, which, however, will be described in detail since the structure is different from the first embodiment. Isolating insulator films 42 and 42a are formed as described previously, and a gate insulating film 43 is formed as shown in FIG. 5(a). Here, this gate insulating film is a silicon oxide film or a silicon oxynitride film having a film thickness of approximately 4 to 6 nm. Further, a MOS transistor, i.e., a transfer transistor in the memory cell portion and a CMOS transistor in the peripheral circuit portion are formed. Gate electrodes 44 and 44a of the transfer transistor formed in the memory cell portion are formed of titanium polycide and the dimension thereof is approximately 0.2 µm. Then, the gate electrode 44a is formed on the isolating insulator film 42. Further, the spacing between the adjacent gate electrodes 44 and 44a is set to approximately 0.3 µm. Furthermore, the film thickness of these gate electrodes 44 and 44a is set to approximately 0.2 µ. In contrast with the above, the dimension of a gate electrode 45 of the CMOS transistor formed in the peripheral circuit portion generally becomes larger than the dimension of the gate electrode of the transfer transistor in the memory cell portion and is set to approximately 0.3 µm. Next, a buffer layer 46 is formed covering the gate electrodes 44, 44a and 45 described previously, and furthermore, an etching stopper layer 47 covering the buffer layer 46 is formed. Here, the buffer layer is a silicon oxide film having a film thickness of approximately 10 nm, and the etching stopper layer is an SRO film having a film thickness of approximately 50 nm. Next, shallow diffused layers 48 and 48a constituting the source and the drain of the MOS transistor are formed. Here, the impurity concentration in these shallow diffused layers 48 and 48a is set to approximately $1 \times 10^{18}$ atoms/$cm^3$.

Figure 5B:
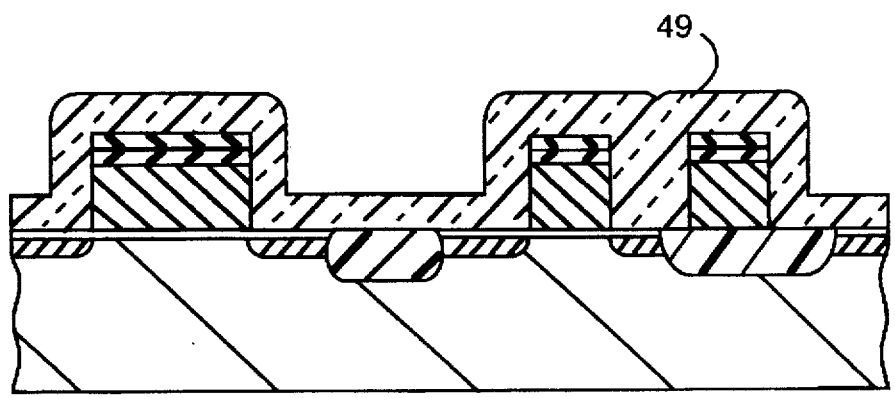
Figure 5C:
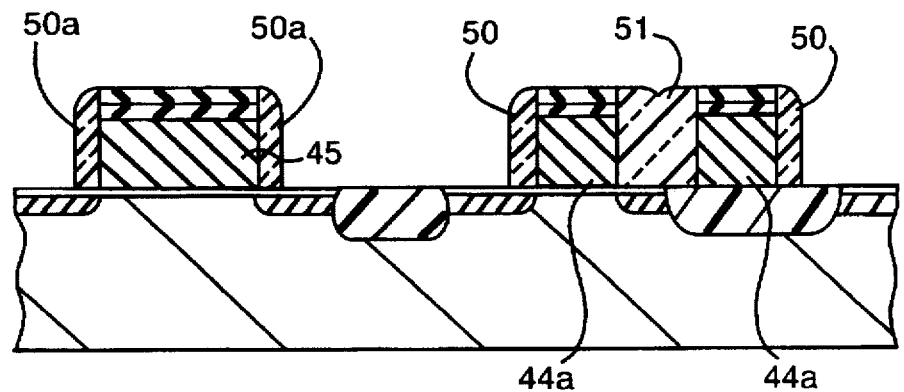

After the arrangement described above, a first covering insulator film 49 having a film thickness of 150 nm is deposited so as to cover the whole surface as shown in FIG. 5(b). Here, the first covering insulator film 49 is a silicon dioxide film formed by a CVD method. Next, anisotropic etching-back is applied to the first covering insulator film 49. With such etching-back, the first sidewall layers 50 and 50a become to be formed on the sidewalls of the gate electrodes 44, 44a and 45 as shown in FIG. 5(c). Here, the film thickness of the first sidewall layers is set to 100 nm. In the process of etching-back, an embedded insulator layer 51 becomes to be formed between gate electrodes 44 and 44a at a short separation distance in the memory cell portion along with the formation of the first sidewall layer described previously.

Figure 5D:
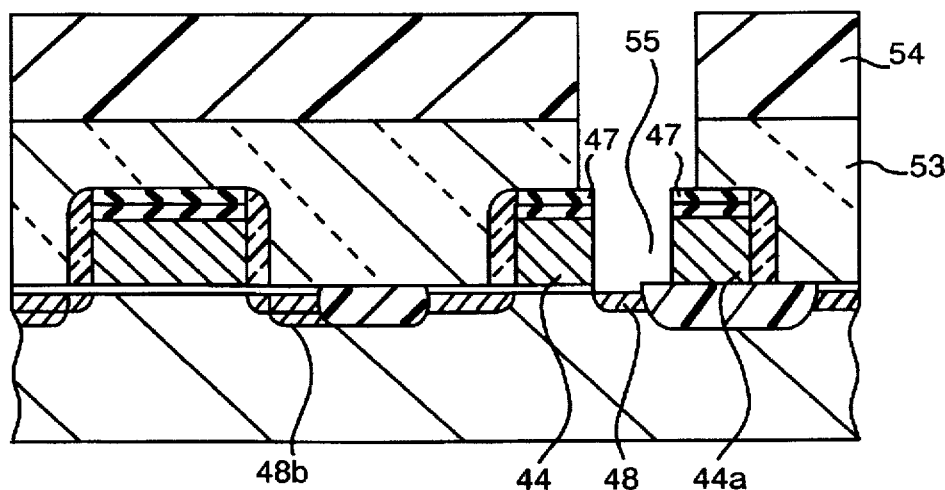

Next, by well-known selective ion implantation, impurities are introduced again only into the shallow diffused layer 48a of the CMOS transistor in the peripheral circuit portion and heat treatment is applied thereto, thereby to form a deep diffused layer 48b shown in FIG. 5(d). Here, the impurity concentration in the deep diffused layer 48b is set to $1\times10^{19}$ to $1\times10^{20}$ atoms/cm$^3$. Thus, the diffused layer of the source and the drain of the CMOS transistor in the peripheral circuit portion is formed so as to show a well-known LDD structure. Next, an interlayer insulating film 53 is formed. Here, the interlayer insulating film 53 is a BPSG film having a film thickness of 400 nm. After such an arrangement, a resist mask 54 for a contact hole is formed by patterning into a predetermined configuration. Then, the interlayer insulating film 53 and the embedded insulator layer 51 are etched using the resist mask 54 as a mask for dry etching. In such a manner, a contact hole 55 is formed. Here, since the etching stopper layer 47 has been formed on the gate electrodes 44 and 44a, a contact hole 55 is formed on the diffused layer 48 and the isolating insulator film 42 being self-aligned with the gate electrodes 44 and 44a as described previously in the dry etching of the interlayer insulating film 53 and the embedded insulator layer 51, it is more desirable that the etching rate ratio of the interlayer insulating film 53 and the embedded insulator layer 51 to the etching stopper layer 7 is made higher. For such a purpose, gas obtained by mixing CO with $C_4F_8$ is used as the reaction gas in the RIE. By selecting such gas, this etching rate ratio becomes approximately 20, and the duties as the etching mask of the etching stopper layer are secured.

Figure 5E:
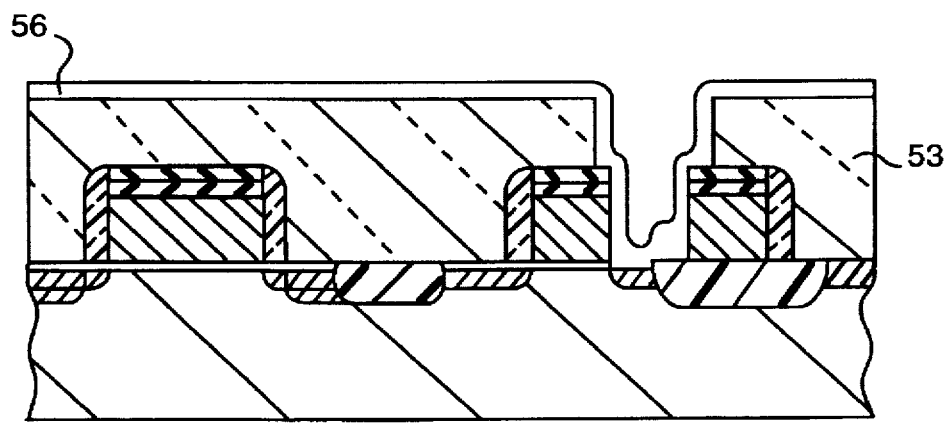

Next, as shown in FIG. 5(e), a second covering insulator film 56 is deposited so as to cover the contact hole 55 and the interlayer insulating film 53 described above. Here, this second covering insulator film 56 is a silicon oxide film having a film thickness of approximately 60 nm. This silicon oxide film is a film formed by a CVD method at a temperature of film formation as high as approximately 800° C.

Figure 5F:
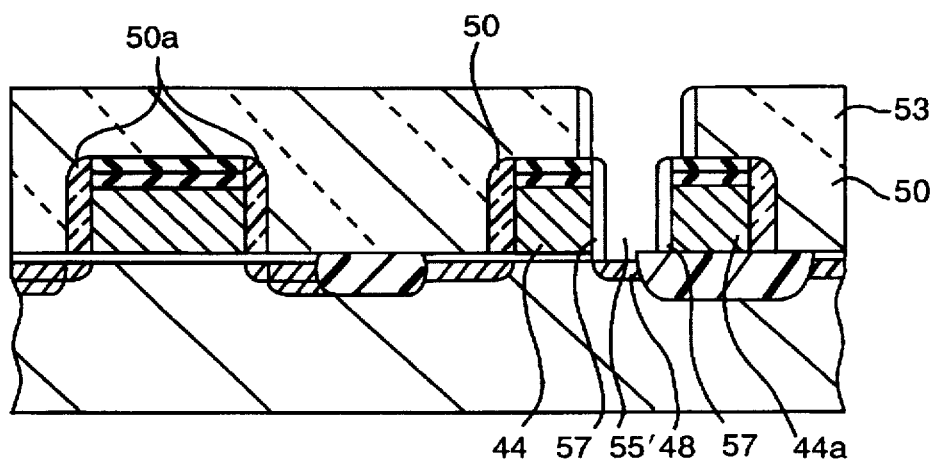

After such arrangement, the second covering insulator film 56 is etched back all over the surface. Here, in the etching-back, mixed gas of $C_4F_8$ and CO is used as the reaction gas of anisotropic RIE. In such a manner, a second sidewall layer 57 is formed on the sidewall portions of the gate electrodes 44 and 44a of the transfer transistor in the memory cell portion as shown in FIG. 5(f). The film thickness of the second sidewall layer 57 in this case is approximately 50 nm. Further, the final dimension of the contact hole 55' becomes approximately 20 nm. Here, an exposed portion of the region of the isolating insulator film is included in about 100 nm in the self-aligned contact hole 55'.

Figure 6:
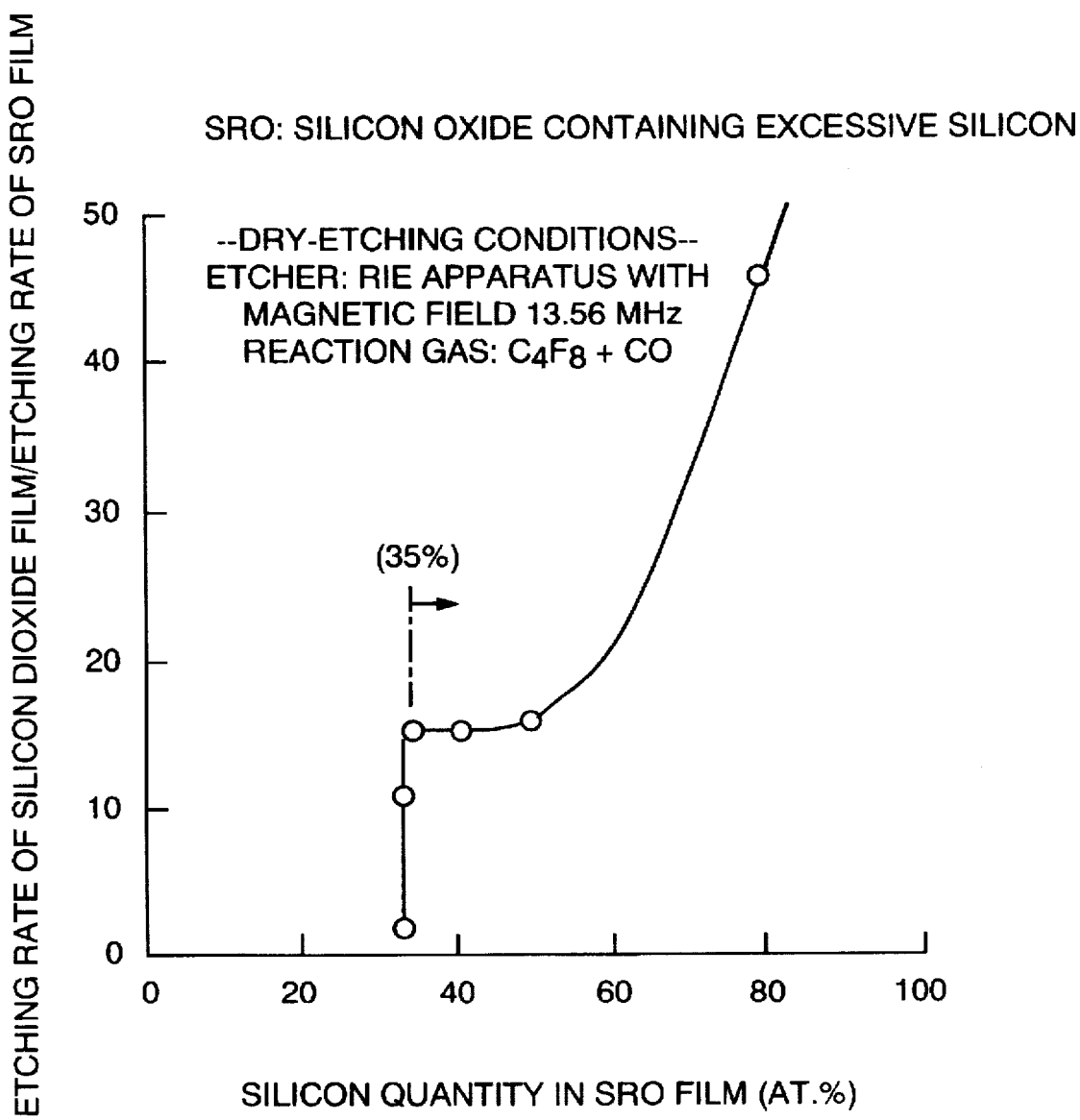
FIG. 6 is a graph showing dry etching characteristics of a silicon oxide film containing excessive silicon (a SRO film)

In the case of the present embodiment, it becomes important to secure the dry etching rate ratio of a silicon dioxide film used as the first covering insulator film to the SRO film. The etching rate ratio will be explained hereinafter based on FIG. 6. A magnetron type apparatus is used as the dry etching apparatus. The frequency of a high-frequency power source of the apparatus in this case is 13.56 MHz that is used normally. Furthermore, CO gas mixed into $C_4F_8$ is introduced as the reaction gas. FIG. 6 is a graph showing the relationship between the ratio of the etching rate of a silicon dioxide film to the etching rate of an SRO film in this case and the silicon quantity contained in the SRO film. As shown in FIG. 6, when the silicon quantity in the SRO film reaches 35% or higher, the etching ratio becomes 15 or higher. Here, the case when the silicon quantity in the SRO film is approximately 33.3% corresponds to the silicon dioxide film. This fact indicates that any SRO film containing excessive silicon of 2% or higher than the silicon dioxide film can be used as the first covering insulator film. The above-mentioned dry etching is performed under such conditions. Besides, the etching rate of the BPSG film used as the interlayer insulating film in the third embodiment is very high as compared with that of a silicon dioxide film.

Figure 7:
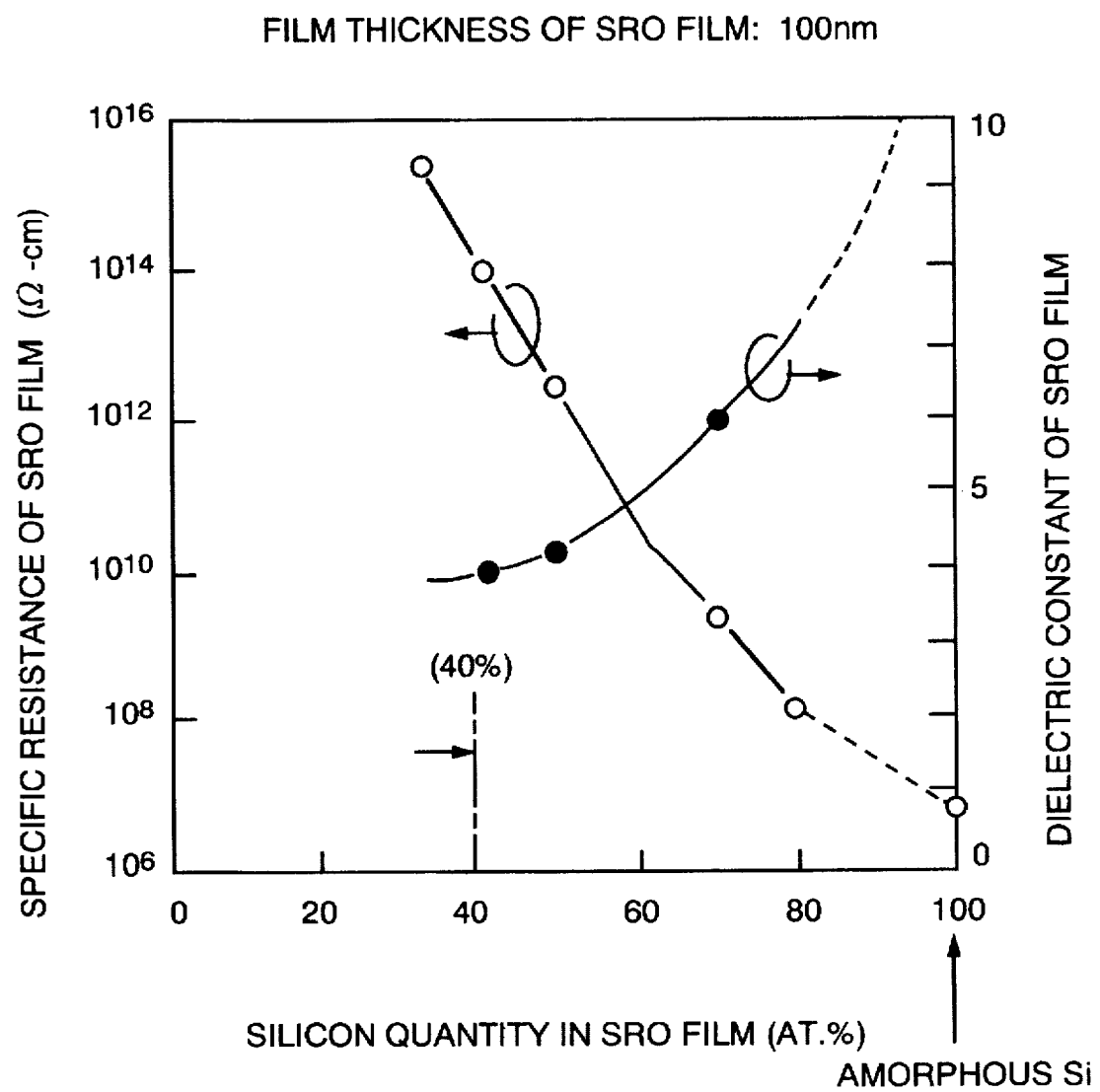
FIG. 7 is a graph showing insulation characteristics of the SRO film.

This SRO film is used as an isolating insulator film. Therefore, it is required to secure dielectric strength of the SRO film. FIG. 7 shows the relationship among a specific resistance and a dielectric constant of an SRO film and an excessive silicon quantity in the SRO film. Here, the film thickness of the SRO film is 100 nm, and the specific resistance is shown with the value when the applied electric field is low ($1\times10^8$ V/cm or less). The allowable leakage current of the diffused layer in a semiconductor device such as a DRAM designed on the dimensional basis of 0.2 µm described previously is in the order of $10^{-17}$ ampere. Thus, the specific resistance value of the isolating insulator film falls within the range that can correspond sufficiently if it is $10^{14}$ Ω·cm or more. In the case of the SRO film, these conditions are satisfied when the silicon quantity is 40 at % or less as seen from FIG. 7. Here, when it is taken into consideration that the case of silicon quantity at 33.3% corresponds to A silicon dioxide film as described previously, the above-mentioned conditions are satisfied when the excessive silicon quantity in the silicon dioxide film is 6 at % or less. Further, the dielectric constant of the SRO film becomes approximately 4 within this range, which is equivalent to that of a silicon dioxide film and causes no problem.

In the case of the third embodiment, both the first sidewall layer and the second sidewall layer are formed of a silicon dioxide film having higher dielectric strength or moisture resistance than a silicon oxide film containing phosphorus glass or boron glass. As a result, a semiconductor device of high quality can be formed more easily than the cases of the first embodiment and the second embodiment. In this manner, a sidewall layer having a thick wall thickness is formed on the sidewall of the gate electrode of the CMOS transistor in the peripheral circuit portion requiring high reliability, then the sidewall layer between gate electrodes in the memory cell portion is removed once, and a sidewall layer having a thin film thickness is formed again on the sidewall of the gate electrodes in the memory cell portion located at mutually narrow spacing. Here, an etching stopper layer formed on the top surface of the gate electrodes is used as the mask of dry etching for forming these sidewall layers. As a result, it becomes possible to form a contact hole for a wiring in a memory cell in a semiconductor device, in particular in a semiconductor storage device such as a DRAM in a self-alignment manner to show high reliability. Further, the process of fabricating the contact hole is stabilized. In addition, deterioration of transistor characteristics or lowering of reliability in the CMOS transistor in the peripheral circuit portion generated frequently in the prior art disappear, and achievement of high density or refinement of the memory cell portion becomes easier, thus promoting reduction in size and achievement of large capacity of the semiconductor device. Furthermore, the performance or the yield of the semiconductor device is improved, and the dispersion thereof is also reduced by a large margin.

Although the invention has been described with reference to specific embodiments, this description is not meant to be construed in a limited sense. Various modifications of the disclosed embodiments will become apparent to persons skilled in the art upon reference to the description of the invention. It is therefore that the appended claims will cover any modifications or embodiments as fall within the scope of the invention.

What is claimed is:

1. A method of fabricating a semiconductor device comprising the steps of:
    forming a plurality of wirings over a semiconductor substrate;
    forming sidewall layers on side faces of said plurality of wirings;
    forming an interlayer insulating film covering said plurality of wirings and said sidewall layers; and
    etching a portion of said interlayer insulating film located between said plurality of wirings and a portion of said sidewall layers by making an etching rate of said sidewall layer substantially equivalent to or higher than the etching rate of said interlayer insulating film, thereby to form a contact hole in said interlayer insulating film.

2. The method of fabricating a semiconductor device as claimed in claim 1, wherein an impurity-doped silicon oxide film is used as said interlayer insulating film and said sidewall layer.

3. The method of fabricating a semiconductor device as claimed in claim 2, wherein said impurity-doped silicon oxide film is selected from the group consisting of a PSG film, a BSG film, a BPSG film and a laminated film thereof.

4. The method of fabricating a semiconductor device as claimed in claim 1, wherein a space between said plurality of wirings is filled up with said sidewall layers to constitute an embedded insulating layer, when said contact hole is formed in said interlayer insulating film, a contact hole is formed in said embedded insulating layer.

5. The method of fabricating a semiconductor device as claimed in claim 4, wherein an impurity-doped silicon oxide film is used as said interlayer insulating film and said embedded insulating layer.

6. The method of fabricating a semiconductor device as claimed in claim 5, wherein said impurity-doped silicon oxide film is selected from the group consisting of a PSG film, a BSG film, a BPSG film and a laminated film thereof.

7. A method of fabricating a semiconductor device comprising the steps of:
    forming a plurality of wirings over a semiconductor substrate;
    forming an etching stopper film on said plurality of wirings, respectively;
    forming sidewall layers on the side faces of said plurality of wirings;
    forming an interlayer insulating film covering said plurality of wirings and said sidewall layers; and
    removing a portion of said interlayer insulating film among said plurality of wirings, wherein an etching rate of said etching stopper film is made lower than the etching rate of said interlayer insulating film and the etching rate of said sidewall layer substantially equivalent to or higher than the etching rate of said interlayer insulating film, thereby to form a contact hole in said interlayer insulating film.

8. The method of fabricating a semiconductor device as claimed in claim 7, wherein an impurity-doped silicon oxide film is used as said interlayer insulating film and said sidewall layer.

9. The method of fabricating a semiconductor device as claimed in claim 8, wherein said impurity-doped silicon oxide film is selected from the group consisting of a PSG film, a BSG film, a BPSG film and a laminated film thereof.

10. The method of fabricating a semiconductor device as claimed in claim 7, wherein said sidewall layers having an impurity-doped silicon oxide film and a coating insulator film, said coating insulator film covering a surface of said semiconductor substrate and keeping said impurity-doped silicon oxide film away from said semiconductor substrate.

11. The method of fabricating a semiconductor device as claimed in claim 7, further comprising a step of covering exposed side faces of said plurality of wirings in said contact hole with an insulating film.

12. The method of fabricating a semiconductor device as claimed in claim 7, wherein a space between said plurality of wirings is filled up with said sidewall layers to constitute an embedded insulating layer, when said contact hole is formed in said interlayer insulating film, a contact hole is formed in said embedded insulating layer.

13. The method of fabricating a semiconductor device as claimed in claim 12, wherein said embedded insulating layer having an impurity-doped silicon oxide film and a coating insulator film, said coating insulator film covering a surface of said semiconductor substrate and keeping said impurity-doped silicon oxide film away from said semiconductor substrate.

14. The method of fabricating a semiconductor device as claimed in claim 12, wherein an impurity-doped silicon oxide film is used as said interlayer insulating film and said embedded insulating layer.

15. The method of fabricating a semiconductor device as claimed in claim 14, wherein said impurity-doped silicon oxide film is selected from the group consisting of a PSG film, a BSG film, a BPSG film and a laminated film thereof.

16. The method of fabricating a semiconductor device comprising the steps of:
    dividing a semiconductor substrate into a memory cell portion and a peripheral circuit portion;
    forming a first gate electrode over said peripheral circuit portion;
    forming second and third gate electrodes over said memory cell portion;
    forming a etching stopper layer on said second and third gate electrodes, respectively;
    forming shallow source and drain regions in said peripheral circuit portion and said memory cell portions, said shallow source and drain regions aligned with said first to third gate electrodes, respectively;
    forming sidewall layers on the side faces of said first to third gate electrodes, respectively;
    forming deep source and drain regions in said peripheral circuit portion, said deep source and drain regions deeper than said shallow source and drains and aligned with said sidewall layers formed on the side faces of said first gate electrode;
    forming an interlayer insulating film covering said first to third gate electrodes and said sidewall layers; and
    etching a portion of said interlayer insulating film located between said second and third gate electrodes, wherein an etching rate of said etching stopper film is made lower than the etching rate of said interlayer insulating film and the etching rate of said sidewall layer substantially equivalent to or higher than the etching rate of said interlayer insulating film, thereby to form a contact hole in said interlayer insulating film.

17. The method of fabricating a semiconductor device as claimed in claim 16, wherein an impurity-doped silicon oxide film is used as said interlayer insulating film and said sidewall layer.

18. The method of fabricating a semiconductor device as claimed in claim 17, wherein said impurity-doped silicon oxide film is selected from the group consisting of a PSG film, a BSG film, a BPSG film and a laminated film thereof.

19. The method of fabricating a semiconductor device as claimed in claim 16, wherein a space between said second and third gate electrodes is filled up with said sidewall layers to constitute an embedded insulating layer, when said contact hole is formed in said interlayer insulating film, a contact hole is formed in said embedded insulating layer.

* * * * *

UNITED STATES PATENT AND TRADEMARK OFFICE
CERTIFICATE OF CORRECTION

PATENT NO. : 5,728,595
DATED : March 17, 1998
INVENTOR(S) : Tadashi Kukase

It is certified that error appears in the above-identified patent and that said Letters Patent is hereby corrected as shown below:

Cover page, at item [30], "Feb. 22, 1995" should be --Feb. 28, 1995--.

Signed and Sealed this

Twenty-seventh Day of October, 1998

Attest:

BRUCE LEHMAN

*Attesting Officer*     *Commissioner of Patents and Trademarks*